United States Patent [19]

Chan et al.

[11] 4,311,930

[45] Jan. 19, 1982

[54] VOLTAGE PROTECTION CIRCUIT FOR BINARY DATA-STORAGE DEVICE

[75] Inventors: John Y. Chan, Belmont; John J. Barnes, Fremont, both of Calif.

[73] Assignee: Fairchild Camera & Instrument Corp., Mountain View, Calif.

[21] Appl. No.: 104,639

[22] Filed: Dec. 17, 1979

[51] Int. Cl.³ .................... H03K 17/16; H03K 17/687
[52] U.S. Cl. ...................... 307/575; 307/548; 307/583
[58] Field of Search ............... 307/200 A, 200 B, 205, 307/246, 251, 442, 453, 546, 547, 548, 572, 575

[56] References Cited

U.S. PATENT DOCUMENTS 3,521,141  7/1970  Walton ........................... 307/251 X
3,729,723  4/1973  Yamamoto ..................... 307/251 X

*Primary Examiner*—John S. Heyman
*Attorney, Agent, or Firm*—Paul J. Winters; Michael J. Pollock; Warren M. Becker

[57] ABSTRACT

A voltage protection circuit for controlling an input data signal on a signal-carrying line to a binary data-storage device having an input line for receiving the input data signal comprises two transistors in series having current-control electrodes coupled to an input control terminal and a third transistor having its current-control electrode coupled to the input line with one current-conducting electrode coupled to a voltage source and another current-conducting electrode coupled to current-conducting electrodes of the first two transistors.

5 Claims, 6 Drawing Figures

VOLTAGE PROTECTION CIRCUIT FOR BINARY DATA-STORAGE DEVICE

BACKGROUND OF THE INVENTION

1. Field of the Invention

This invention relates generally to electronic circuits for controlling input data signals to binary data-storage devices and more particularly to circuits which protect such devices from excessive voltage excursions in the input data signals.

2. Description of the Prior Art

Within the prior art, access to a binary data storage device is typically controlled through a transistor which is turned on to access the device and is turned off for isolating the device.

Referring to the drawings, FIG. 1 shows a prior art arrangement for accessing a typical binary data-storage device 10 comprising a storage capacitor C1 to ground coupled through an input line conductor 12 at a node A to the gate electrode G1 of an enhancement-mode N-channel metal-oxide semiconductor (MOS) field-effect transistor Q1 having a first source-drain electrode DS1 coupled to output terminal 14 and having a second source-drain electrode SD1 coupled to terminal 15; in one example, terminal 15 is connected to ground. Capacitor C1 may simply be the parasitic input capacitance associated with input line 12. According to the conventional definition, device 10 is in the low logic or binary "0" state when capacitor C1 is not charged (or is substantially discharged) and is in the high logic or binary "1" state when capacitor C1 is charged to a prescribed level.

Device 10 is accessed along input line 12 through an enhancement-mode N-channel MOS field-effect transistor Q2 having a first source-drain electrode SD2 coupled through a signal-carrying conductor 16 to an input data terminal 18 and having a second source-drain electrode DS2 connected to input line 12 as shown in FIG. 1. An input data signal $V_{IN}$ is applied at input data terminal 18 for transferring a binary data bit comprising either a "0" when data signal $V_{IN}$ is at a binary low voltage or a "1" when data signal $V_{IN}$ is at a binary high voltage through transistor Q2 into device 10. The gate electrode G2 of transistor Q2 is coupled to an input control terminal 20 at which an input control signal $\phi$ is applied to control the conducting/non-conducting operation of transistor Q2. When control signal $\phi$ is at a binary logical high voltage—i.e., a positive voltage exceeding the threshold voltage of transistor Q2—data signal $V_{IN}$ is written into device 10. Switching control signal $\phi$ to a binary logical low voltage—i.e., a voltage below the threshold voltage of transistor Q2—is intended to turn off transistor Q2 and thereby to isolate or disconnect device 10 from input data terminal 18 and data signal $V_{IN}$.

As long as data signal $V_{IN}$ is at or above its binary low voltage, there is substantially no change in the state of device 10 due to changes in data signal $V_{IN}$ when control signal $\phi$ is at its logical low voltage. However, noise or other activities in the circuitry preceding input data terminal 18 often causes data signal $V_{IN}$ to undershoot below its binary low voltage. If the magnitude of this negative undershoot in data signal $V_{IN}$ exceeds the threshold voltage of transistor Q2, it then turns on. A "1" stored in capacitor C1 then discharges through transistor Q2 and is degraded or destroyed.

FIGS. 2 and 3 illustrate two prior art arrangements utilized to reduce sensitivity to a negative voltage undershoot in data signal $V_{IN}$.

The circuitry of FIG. 1 is modified in FIG. 2 by including another enhancement-mode N-channel MOS field-effect transistor Q3 between input data terminal 18 and device 10. Transistor Q3 has its gate electrode G3 connected to input control terminal 20 to receive control signal $\phi$, a first source-drain electrode SD3 coupled through a node B to source-drain electrode DS2 of transistor Q2, and a second source-drain electrode DS3 connected to node A. Node B is coupled through an RC network comprising a capacitor C2 and a resistor R1 to a positive voltage source $V_{DD}$. Capacitor C2 discharges when data signal $V_{IN}$ is at a low voltage level. This serves to reduce the transitory rate at which the voltage changes at node A. However, the RC network provides little protection against a sustained negative input undershoot in data signal $V_{IN}$.

The prior art circuit of FIG. 3 utilizes transistor Q3 connected as described for FIG. 2. However, instead of the RC network, an enhancement-mode N-channel MOS field-effect transistor Q4 is coupled by its source S4 to node B. The drain D4 and the gate G4 of transistor Q4 are coupled to each other and to a substrate supply voltage source $V_{SS}$ which is typically at ground potential. Similarly, another enhancement-mode N-channel MOS transistor Q5 is coupled through its source S5 to signal-carrying conductor 16. The drain D5 and gate G5 of transistor Q5 are connected to each other and likewise to voltage source $V_{SS}$. When data signal $V_{IN}$ drops to a negative value whose magnitude exceeds the threshold voltage of transistor Q2, current is provided through diode-connected transistors Q4 and Q5 from voltage source $V_{SS}$ as well as from node A. By proper sizing of transistors Q4 and Q5, the voltage loss at node B may transiently be significantly decreased and the degradation of a "1" in device 10 due to spike negative voltage undershoot in data signal $V_{IN}$ is reduced. As with the circuit shown in FIG. 2, the circuit of FIG. 3 provides little protection against a sustained negative input undershoot.

SUMMARY OF THE INVENTION

In accordance with the present invention, an electronic circuit for controlling an input data signal on a signal-carrying line to a binary data-storage device having an input line for receiving the input data signal comprises: a first transistor having a first current-conducting electrode coupled to the signal-carrying line, a second current-conducting electrode, and a current-control electrode coupled to an input control terminal; a second transistor having a first current-conducting electrode coupled to the second current-conducting electrode of the first transistor, a second current-conducting electrode coupled to the input line, and a current-control electrode coupled to the input control terminal; and a third transistor having a first current-conducting electrode coupled to the second current-conducting electrode of the first transistor and to the first current-conducting electrode of the second transistor, a second current-conducting electrode coupled to a voltage source, and a current-control electrode coupled to the input line. A control signal is applied at the input control terminal.

In one embodiment, the first, second, and third transistors are each enhancement-mode N-channel field-effect transistors and the data-storage device is capable of storing either a binary "1" corresponding to a binary high voltage in the input data signal or a binary "0" corresponding to a binary low voltage in the input data signal. This embodiment acts to protect a "1" in the device from degradation due to a negative voltage undershoot below the binary low voltage in the input data signal.

In other embodiments, the first, second, and third transistors are each enhancement-mode P-channel field-effect transistors and the device is capable of storing either a binary "1" corresponding to a binary low voltage in the input signal or a binary "0" corresponding to a binary high voltage in the input data signal. This other embodiment serves to protect a "1" from degradation due to a positive voltage overshoot beyond the binary high voltage in the input data signal.

BRIEF DESCRIPTION OF THE DRAWINGS

Like reference symbols are employed in the drawings to represent the same item or items in the drawings and in the description of the preferred embodiments.

DESCRIPTION OF THE PREFERRED EMBODIMENTS

Figure 1:
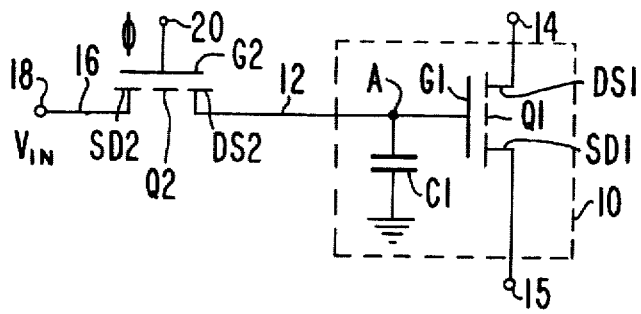
FIG. 1 is a diagram of a prior art circuit used to control an input data signal to a binary data-storage device.
Figure 2:
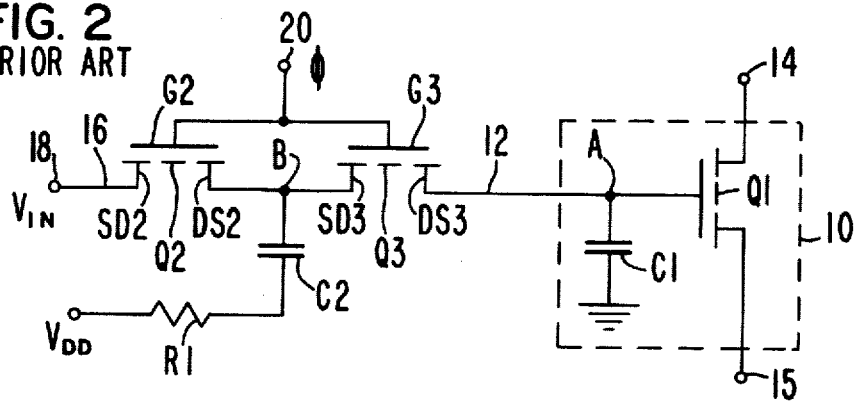
FIGS. 2 and 3 are diagrams of prior art circuits for reducing degradation in the high logic state of a binary data-storage device due to an excessive voltage excursion in an input data signal.
Figure 3:
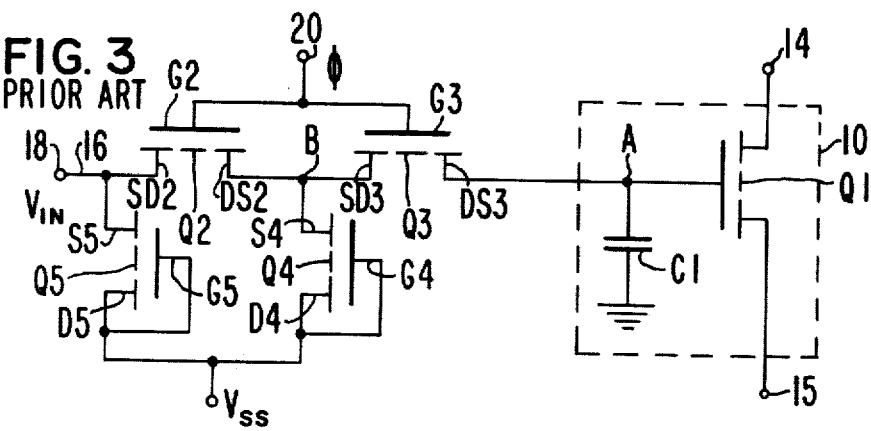
Figure 4:
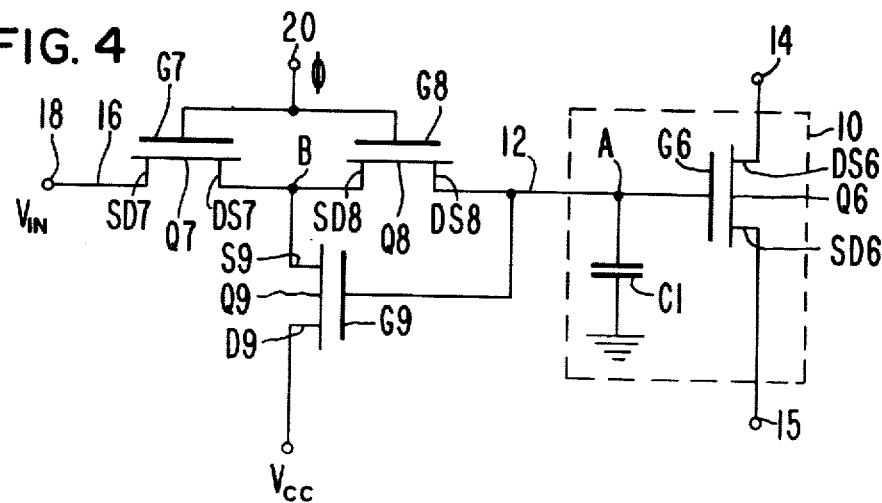
FIG. 4 is a diagram of a circuit in accordance with this invention for controlling an input data signal to a binary data-storage device.

Referring to the drawings, FIG. 4 illustrates a circuit according to the invention for controlling input data signal $V_{IN}$ on input line conductor 12 to binary data-storage device 10. Device 10 is typically an input device for a data input buffer or a logic circuit but may be any control input buffer circuit or a part of a memory directly. In the embodiment of FIG. 4, device 10 comprises capacitor C1 to ground coupled through input line 12 at node A to the gate electrode G6 of an enhancement mode field-effect transistor Q6 having a first source-drain electrode DS6 coupled to output terminal 14 and having a second source-drain electrode SD6 coupled to terminal 15; depending on the desired usage of device 10, terminal 15 may be connected either to other circuitry or to ground; transistor Q6 is either an N-channel or a P-channel device depending on the other transistors used in the present circuit. Device 10 might alternatively comprise or include one or more other elements such as junction field-effect transistors or bipolar transistors or various combinations of field-effect transistors, junction field-effect transistors, and bipolar transistors.

Device 10 exists in a low logic or binary "0" state or in a high logic or binary "1" state. In the case of "positive logic," a binary low voltage in data signal $V_{IN}$ corresponds to a binary "0" being written into device 10, and a binary high voltage in data signal $V_{IN}$ corresponds to a binary "1" being written into device 10. In the case of "negative logic," a binary high voltage in data signal $V_{IN}$ corresponds to a "0" being transferred into device 10, and a binary low voltage (a high negative voltage) corresponds to a "1" being written into device 10. Opposite definitions could as well be adopted.

As illustrated in FIG. 4, the present circuit includes enhancement-mode field-effect transistors Q7 and Q8 connected generally as previously described for transistors Q2 and Q3. Transistor Q7 has a first source-drain electrode SD7 coupled through signal-carrying line 16 to input data terminal 18 at which data signal $V_{IN}$ is applied, a second source-drain electrode DS7 coupled to node B, and a gate electrode G7 coupled to input control terminal 20 at which control signal $\phi$ is applied. Transistor Q8 has a first source-drain electrode SD8 coupled to node B, a second source-drain electrode DS8 coupled through input line 12 to node A of device 10, and a gate electrode G8 coupled to input control terminal 20.

The source electrode S9 of an enhancement-mode field-effect transistor Q9 is coupled through node B to source-drain electrode DS7 of transistor Q7 and to source-drain electrode SD8 of transistor Q8. The drain electrode D9 of transistor Q9 is coupled to a voltage source $V_{CC}$. The gate electrode G9 of transistor Q9 is coupled to input line 12.

Preferably, transistors Q7, Q8 and Q9 are each N-channel MOS devices having threshold voltages of about 0.7 volt. Likewise, transistor Q6 is an N-channel device in which electrode SD6 is the source and electrode DS6 is the drain. Voltage source $V_{CC}$ is a positive potential of approximately 5.0 volts.

The write a data bit into device 10 in this preferred embodiment, control signal $\phi$ is first raised to a (high) voltage above the threshold voltages of transistors Q7 and Q8. If device 10 contains a "0", setting data signal $V_{IN}$ at a binary high voltage of 2.0 to 7.0 volts causes current to be transmitted through transistors Q7 and Q8 into device 10 to write in a "1" at the binary high voltage which appears at node A, while setting data signal $V_{IN}$ at a binary low voltage of $-1.0$ to 0.8 volts causes no change in the "0" logic state of device 10. Conversely, if device 10 contains a "1" and control signal $\phi$ is at its high voltage, setting data signal $V_{IN}$ at the binary low voltage causes current to flow from device 10 to drop it to a "0" at the binary low voltage which appears at node A while setting data signal $V_{IN}$ at the binary high voltage does not disturb the "1" in binary device 10.

When control signal $\phi$ is at its high voltage and node A is at the binary low voltage, this voltage is transmitted to gate electrode G9 and through transistor Q8 across node B to source electrode S9. However, this (binary low) voltage is too low to cause transistor Q9 to turn on; transistor Q9 is therefore an inactive element in this situation. When node A is at the binary high voltage, this voltage is transmitted to gate electrode G9 and through transistor Q8 across node B to source electrode S9. Since the voltage at gate electrode G9 does not exceed the voltage at source electrode S9 by approximately the threshold voltage of transistor Q9, no current flows through transistor Q9. Thus, transistor Q9 does not affect the operation of the present circuit when control signal $\phi$ is at the appropriate high voltage and data signal $V_{IN}$ is at either the binary low voltage or the binary high voltage (or in between).

Now, when control signal $\phi$ is at a low voltage below the threshold voltages for transistors Q7 and Q8, a negative voltage undershoot in data signal $V_{IN}$ below the binary low voltage with a magnitude greater than the threshold voltage of transistor Q7 causes transistor Q7 to begin to conduct. The voltage at node B decreases, but a voltage difference exists across transistor Q7 so that the voltage at node B exceeds the undershoot voltage of data signal $V_{IN}$. If device 10 contains a "1" which appears as the binary high voltage at gate electrode G9 and the voltage at node B which appears at source electrode S9 drops below the (binary high) voltage at gate electrode G9 by an amount equal to or exceeding the threshold voltage of transistor Q9, it begins to conduct and a current is provided from voltage source $V_{cc}$ across transistors Q9 and Q7 to input terminal 18. This acts to prevent the voltage at node B from dropping further. By properly sizing transistors Q7, Q8, and Q9, voltage at node B which appears at source-drain electrode SD8 does not drop below the logical low voltage of control signal $\phi$ appearing at gate electrode G8. Transistor Q8 thereby remains off substantially irrespective of the magnitude or time duration of the negative voltage undershoot.

Accordingly, transistor Q9 acts to protect a "1" in device 10 from degradation due to a negative voltage undershoot whose magnitude exceeds the threshold voltage of transistor Q7. On the other hand, when device 10 contains a "0" and control signal $\phi$ is at the low voltage, a negative undershoot in data signal $V_{IN}$, while capable of placing transistors Q7 and Q9 in the conducting state, does not affect the "0" in device 10. Therefore, setting control signal $\phi$ at the low voltage below the threshold voltages of transistors Q7 and Q8 successfully isolates or disconnects device 10 irrespective of the value of data signal $V_{IN}$.

In another embodiment, transistors Q7, Q8, and Q9 are each P-channel MOS devices. Voltage source $V_{CC}$ is a negative potential in the range of $-3$ to $-20$ volts. Operation is substantially the same as that described above for the preferred embodiment described above, except that negative logic is employed and the voltage polarities are generally inverted. In this situation, the circuit of the present invention acts to protect a "1" in device 10 from degradation due to a positive voltage overshoot in data signal $V_{IN}$ beyond the binary high voltage. In particular, the present circuit substantially nullifies the effect of a positive voltage overshoot exceeding the magnitude of the threshold voltage of transistor Q7. Again, a positive voltage overshoot has no effect on a "0" contained in device 10.

For each field-effect transistor, the source electrode and the drain electrode or the two source-drain electrodes are current-conducting electrodes. The gate electrode for each field-effect transistor is a current-control electrode.

Figure 5A:
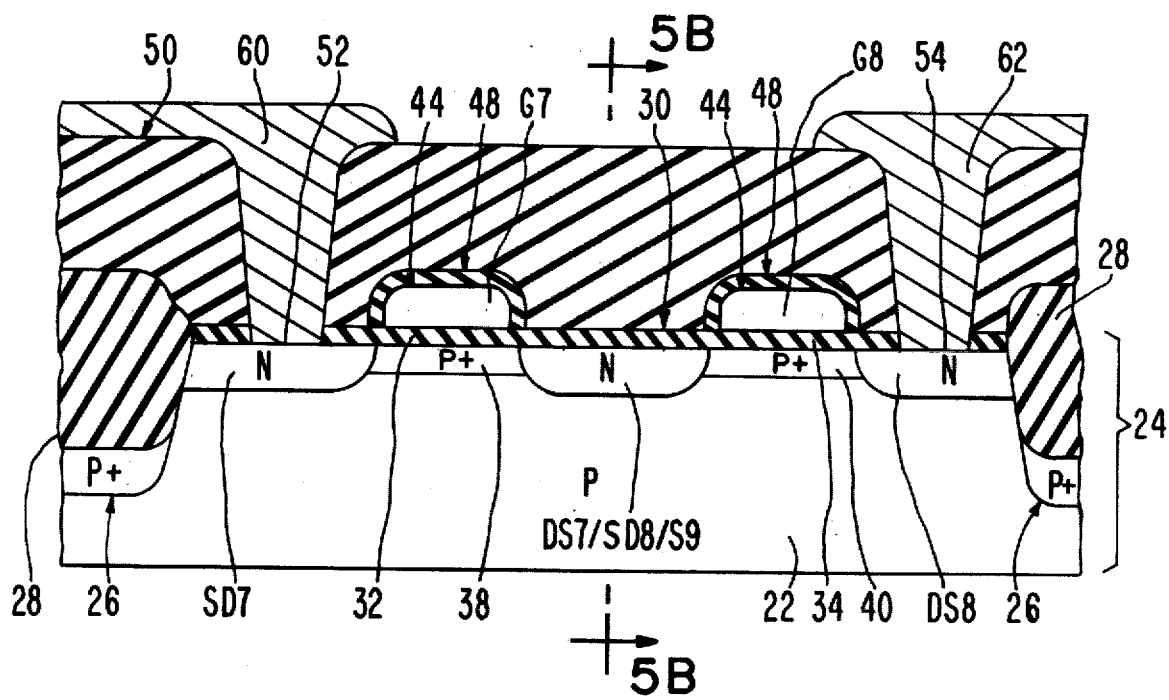
FIGS. 5a and 5b are cross-sectional views of a particular embodiment of the circuit of FIG. 4.
Figure 5B:
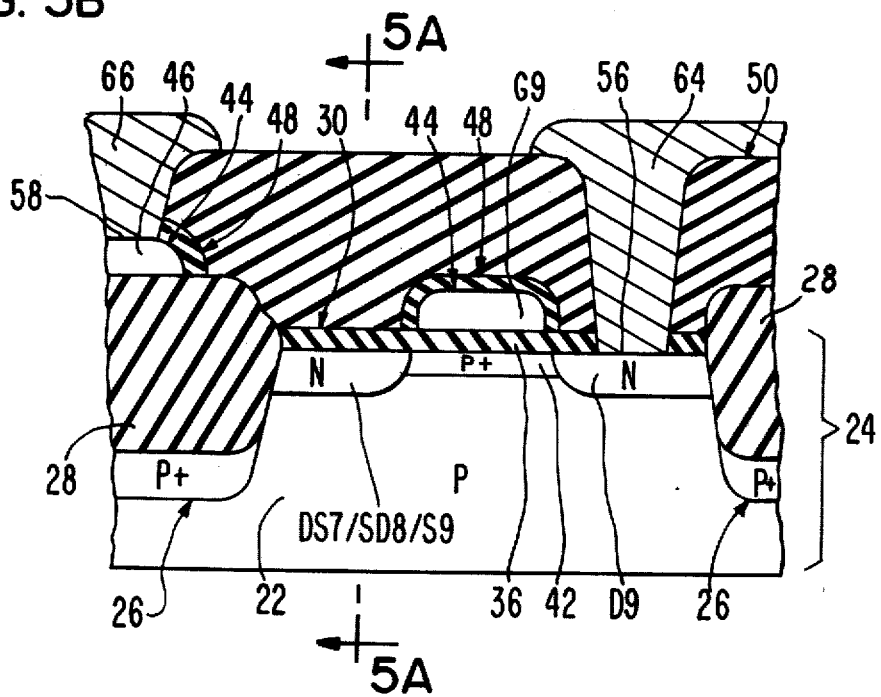

FIGS. 5a and 5b display cross-sectional view of transistors Q7, Q8, and Q9 in the embodiment where they are N-channel devices for illustrating their fabrication on a semiconductor wafer. The cross sections are taken through the planes indicated by the arrows in FIGS. 5a and 5b. Conventional masking, etching, and cleaning techniques are employed in creating the various P-type, N-type, electrode, and insulating regions. To simplify the discussion, references to the masking, etching, cleaning, and other well-known steps in the semiconductor prior art are omitted from the following fabrication discussion.

Boron is normally used as the P-type impurity for creating the various regions of P-type conductivity in the wafer. Phosphorous, arsenic, and antimony are used selectively as complementary N-type dopants in the wafer. Other appropriate impurities may be used in place of these dopants. In many of the ion implantation steps below, impurities may generally be introduced into the wafer alternatively by diffusion methods.

The starting material is a silicon substrate 22 of P-type semiconductor material having an original thickness indicated by item 24. The resistivity of substrate 22 is 11–18 ohm-centimeters.

A standard P-type ion implantation is performed in those portions of substrate 22 that will not contain active elements to create more heavily doped P+ regions 26 for preventing surface inversion. The well-known silicon nitride technique is used to define the active areas of the wafer.

Oxide isolation regions 28 are then formed in substrate 22 according to techniques similar to those disclosed in U.S. Pat. No. 3,913,211, "Method of MOS Transistor Manufacture," and U.S. Pat. No. 3,936,858, "MOS Transistor Structure," on inventions of R. Seeds et al. for electrically isolating selected portions of the wafer. U.S. Pat. Nos. 3,913,211 and 3,936,858 are specifically incorporated by reference herein.

The top surface of the wafer is thermally oxidized to form an electrically insulating layer 30 of silicon dioxide. Insulation layer 30 has a thickness of approximately 500 angstroms. Portions of layer 30 serve as gate dielectrics 32, 34, and 36 for transistors Q7, Q8, and Q9, respectively.

In growing a silicon dioxide layer such as layer 30, silicon dioxide also grows at the silicon dioxide-silicon interfaces of other portions of the wafer that already contain silicon dioxide such as oxide isolation regions 28. These additional oxide growths do not significantly affect the electrical properties of the voltage protection circuit. To simplify the discussion herein, the additional oxide growths are not illustrated in the drawings and are not further referred to herein. Similarly, no reference is made to a corresponding removal of silicon dioxide from a portion of the wafer having an additional oxide growth at a prior-existing region of silicon dioxide.

Holes may be etched through layer 30 to define areas for subsequent buried contacts between polycrystalline silicon electrical connections and selected cell components in the peripheral circuitry. No such holes through layer 30 are shown in FIGS. 5a and 5b since no buried contacts to substrate 22 need be employed in transistors Q7, Q8, and Q9.

A P-type impurity (boron) is implanted through the portions of layer 30 corresponding to gate dielectrics 32, 34, and 36 to create channel regions 38, 40, and 42 for transistors Q7, Q8, and Q9, respectively. This P-type implantation establishes the desired threshold voltages for transistors Q7, Q8, and Q9 and various other field-effect transistors employed with the present voltage protection circuit.

A layer 44 of polycrystalline silicon having a thickness of approximately 6,000 angstroms is deposited on the wafer. An N-type impurity (arsenic or phosphorus) is ion implanted (or diffused) according to conventional techniques into layer 44 to set the resistivity for polycrystalline silicon layer 44. The ion implantation dose is approximately $10^{16}$ ions/centimeter$^2$. Silicon layer 44 is then removed everywhere from the top surface of the wafer except where portions of layer 44 remain for gate electrodes G7, G8, and G9, gate electrodes of other field-effect transistors, and electrical interconnections including interconnection 46 which connects gate electrodes G7 and G8.

An N-type impurity (arsenic) is ion implanted at a dosage of $10^{16}$ ions/centimeter$^2$ through layer 30 to create source-drain region SD7 for transistor Q7, region DS7/SD8/S9, source-drain region DS8 for transistor Q8, and drain region D9 for transistor D9. Region DS7/SD8/S9 acts integrally as source-drain DS7 for transistor Q7, source-drain SD8 for transistor Q8, and source S9 for transistor Q9. The sheet resistance of regions SD7, DS7/SD8/S9, DS8, and D9 is approximately 30 ohms per square. The N-type implantation also increases the conductivity of the remaining portions of silicon layer 44.

Another thermal oxidation is performed on the wafer to create insulation layer 48 of silicon dioxide. The finally remaining portions of polycrystalline silicon layer 44 then constitute gate electrodes G7, G8, and G9 and the various interconnections including interconnection 46.

According to conventional techniques, a layer 50 of heavily phosphorus-doped silicon dioxide is deposited upon the wafer and heated to create a smooth upper surface. Holes are selectively etched through layers 30 and 50 to define electrical contact areas 52, 54, and 56 corresponding to source-drain SD7, source-drain DS8, and drain D9, respectively. A hole is also etched through layers 48 and 50 to define an electrical contact area 58 to interconnection 46.

Aluminum is deposited on the wafer and in these holes and then selectively etched to form electrical contacts 60, 62, 64, and 66 to regions SD7, DS8, S9, and 46, respectively, and various peripheral interconnect lines. Contact 60 connects to input data terminal 18. Contact 62 connects below the upper surface of layer 50 to gate electrode G9 and through input line 12 to device 10. Contact 64 connects to voltage source $V_{CC}$. Contact 66 connects to input control terminal 20.

All other transistors and other components employed with the invention may be fabricated in the manner described above for transistors Q7, Q8, and Q9. Where transistors Q7, Q8 and Q9 are P-channel devices, semiconductor materials of the opposite conductivity type to those described above are generally employed to accomplish the same results.

The circuit of the invention may be manufactured according to semiconductor-on-insulating-substrate techniques such as silicon-on-sapphire techniques in which an electrical insulator such as sapphire having a layer of a semiconductor material such as undoped silicon thereon is used as the starting material instead of silicon substrate 22; the fabrication procedure is substantially as described above.

While the invention has been described with reference to particular embodiments, the description is solely for the purpose of illustration and is not to be construed as limiting the scope of the invention claimed below. For example, other types of transistors such as junction field-effect transistors may be utilized in place of some or all of the field-effect transistors described above; for a junction field-effect transistor, the source and drain electrodes comprise current-conducting electrodes and the gate junction electrode comprises a current-control electrode; Thus, various modifications, changes, and applications may be made by those skilled in the art without departing from the true scope and spirit of the invention as defined by the appended claims.

What is claimed is:

1. An electronic circuit for controlling an input data signal on a signal-carrying line conductor to a binary data-storage device having (1) an input line conductor for receiving the input data signal, (2) a capacitance between the input line conductor and a substantially constant voltage reference, and (3) a first transistor having a current-control electrode coupled to the input line conductor, the circuit comprising:

a second transistor having (1) a first current-conducting electrode coupled to the signal-carrying line conductor, (2) a second current-conducting electrode, and (3) a current-control electrode coupled to an input control terminal;

a third transistor having (1) a first current-conducting electrode coupling to the second current-conducting electrode of the second transistor, (2) a second current-conducting electrode coupled to the input line conductor, and (3) a current-control electrode coupled to the input control terminal; and a fourth transistor having (1) a first current-conducting electrode coupled to the second current-conducting electrode of the second transistor and to the first current-conducting electrode of the third transistor, (2) a second current-conducting electrode coupled to a source of a substantially constant bias voltage, and (3) a current-control electrode coupled to the input line conductor.

2. An electronic circuit for controlling an input data signal to a binary data-storage device having an input line conductor for receiving the input data signal, a capacitance between the input line conductor and a substantially constant voltage reference, and a first transistor having a current-control electrode coupled to the input line conductor, the input data signal being on a signal-carrying line conductor coupled to a first current-conducting electrode of a second transistor having a second current-conducting electrode coupled to the input line conductor and having a current-control electrode coupled to an input control terminal, the circuit comprising:

a third transistor having (1) a first current-conducting electrode coupled to the second current-conducting electrode of the second transistor, (2) a second current-conducting electrode coupled to the input line conductor, and (3) a current-control electrode coupled to the input control terminal; and a fourth transistor having (1) a first current-conducting electrode coupled to the second current-conducting electrode of the second transistor and to the first current-conducting electrode of the third transistor, (2) a second current-conducting electrode coupled to a source of a substantially constant bias voltage, and (3) a current-control electrode coupled to the input line conductor.

3. An electronic circuit as in claim 1 or 2 wherein each of the second, third, and fourth transistors is an enhancement-mode N-channel field-effect transistor, the input data signal is characteristically at either a binary high voltage or at a binary low voltage, and the binary device is capable of existing in a binary high logic state corresponding to the binary high voltage and in a binary low logic state corresponding to the binary low voltage, the circuit acting to protect the binary high logic state from degradation due to a negative voltage undershoot below the binary low voltage in the input data signal.

4. An electronic circuit as in claim 3 wherein the current-conducting electrodes of the second transistor are interchangeably a source electrode and a drain electrode, the current-conducting electrodes of the third transistor are interchangeably a source electrode and a drain electrode, the first and second current-conducting electrodes of the fourth transistor are respectively a source electrode and a drain electrode, and each current-control electrode is a gate electrode.

5. An electronic circuit as in claim 1 or 2 wherein each of the second, third, and fourth transistors is an enhancement-mode P-channel field-effect transistor, the input data signal is characteristically at either a binary low voltage or at a binary high voltage, and the binary device is capable of existing in a binary high logic state corresponding to the binary low voltage and in a binary low logic state corresponding to the binary high voltage, the circuit acting to protect the binary high logic state from degradation due to a positive voltage overshoot beyond the binary high voltage in the input data signal.

* * * * *